(12) United States Patent
Griswold et al.

(10) Patent No.: US 7,495,437 B2
(45) Date of Patent: Feb. 24, 2009

(54) METHOD FOR MRT IMAGING ON THE BASIS OF CONVENTIONAL PPA RECONSTRUCTION METHODS

(75) Inventors: Mark Griswold, Shaker Heights, OH (US); Vladimir Jellus, Erlangen (DE); Stephan Kannengiesser, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 151 days.

(21) Appl. No.: 11/409,373

(22) Filed: Apr. 21, 2006

(65) Prior Publication Data

US 2006/0284812 A1   Dec. 21, 2006

(30) Foreign Application Priority Data

Apr. 22, 2005   (DE) ..................... 10 2005 018 814

(51) Int. Cl.
G01V 3/00   (2006.01)
(52) U.S. Cl. ..................... 324/307; 324/309; 324/318
(58) Field of Classification Search ......... 324/300–322; 345/92; 600/410, 411; 382/284
See application file for complete search history.

(56) References Cited

U.S. PATENT DOCUMENTS

| 6,018,600 | A  | * | 1/2000 | Levin et al. | ................. | 382/284 |
| 6,567,567 | B1 | * | 5/2003 | Levin et al. | ................. | 382/284 |
| 6,841,998 | B1 | * | 1/2005 | Griswold | .................... | 324/309 |
| 7,053,613 | B2 | * | 5/2006 | Lin | ............................ | 324/307 |
| 7,202,663 | B2 | * | 4/2007 | Huang | ........................ | 324/309 |
| 7,423,430 | B1 | * | 9/2008 | Sharif et al. | ............... | 324/309 |
| 2003/0076099 | A1 | | 4/2003 | Hajnal et al. | ................ | 324/307 |
| 2004/0111220 | A1 | | 6/2004 | Ochs et al. | .................... | 702/19 |
| 2004/0193038 | A1 | | 9/2004 | Reykowski et al. | ......... | 600/410 |
| 2005/0100202 | A1 | * | 5/2005 | Huang | ........................ | 382/128 |
| 2005/0270024 | A1 | * | 12/2005 | Lin | ............................ | 324/307 |
| 2006/0261810 | A1 | * | 11/2006 | Fautz et al. | ................. | 324/309 |
| 2006/0273792 | A1 | * | 12/2006 | Kholmovski et al. | ........ | 324/309 |
| 2006/0284812 | A1 | * | 12/2006 | Griswold et al. | ............. | 345/92 |

(Continued)

OTHER PUBLICATIONS

"Adaptive Reconstruction of Phased Array MR Imagery," Walsh et al, Magnetic Resonance in Medicine, vol. 43, (2000), pp. 682-690.

*Primary Examiner*—Diego Gutierrez
*Assistant Examiner*—Tiffany A Fetzner
(74) *Attorney, Agent, or Firm*—Schiff Hardin LLP

(57) ABSTRACT

In a method and apparatus for generating a magnetic resonance image of a contiguous region of a human body on the basis of partial parallel acquisition (PPA) by excitation of nuclear spins and measurement of radio-frequency signals indicating the excited spins, the spin excitation is implemented in steps with measurement of an RF response signal simultaneously in each of a number of N component coils. A number of response signals thus are acquired that, for each component coil, form an incomplete data set (40) of acquired RF signals. Additional acquired calibration data points exist for each incomplete data set. The N incomplete data sets are acquired to a subset of M reduced, incomplete data sets on the basis of an N×M reduction matrix, so that M reduced, incomplete data sets are obtained, M complete data sets are formed on the basis of an N×M reconstruction matrix with the non-measured lines of the M reduced, incomplete data sets being reconstructed from all N incomplete data sets. A spatial transformation of the completed reduced data sets is then implemented in order to form a complete image data set from each completed, reduced data set.

11 Claims, 7 Drawing Sheets

U.S. PATENT DOCUMENTS

2007/0013374 A1* 1/2007 Griswold et al. ............ 324/309
2008/0012562 A1* 1/2008 Beatty ........................ 324/307
2008/0139919 A1* 6/2008 Kannengiesser et al. .... 600/410
2008/0197844 A1* 8/2008 Ying et al. .................. 324/309

* cited by examiner

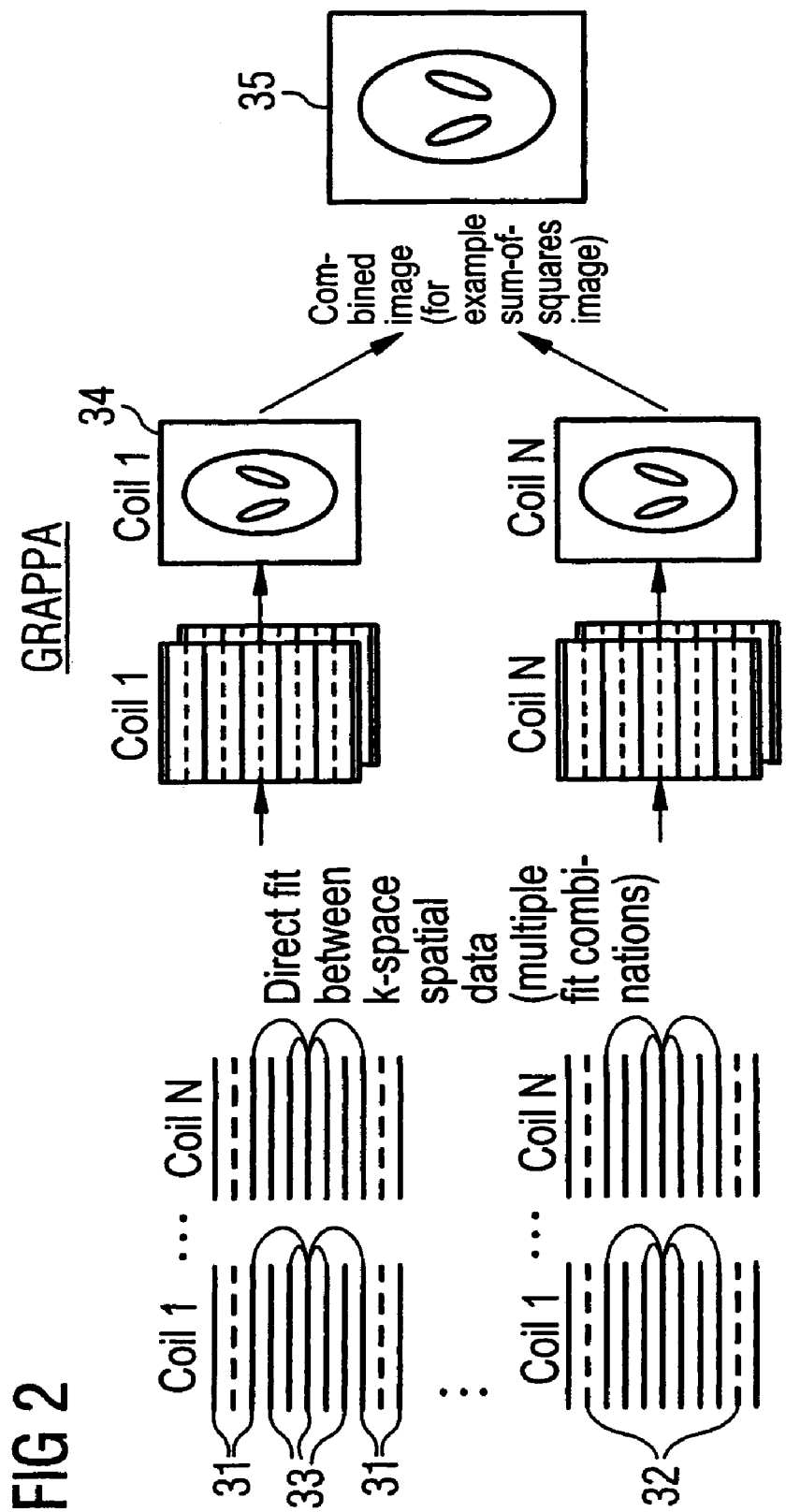

CHA: Variety of the channels = = signals of the component coils

▨ measured lines
▭ measured reference lines
▬ non-measured (omitted) lines
▩ GRAPPA reconstructed lines X = GRAPPA reconstruction matrix
X' = Reduced GRAPPA reconstruction matrix
(reference lines were used for calculation of
X, X'; not shown)

▰▰▰ measured lines
▭▭▭ non-measured (omitted) lines
▨▨▨ GRAPPA reconstructed lines FIG 6  Example: N=3 ⇔ M=2

METHOD FOR MRT IMAGING ON THE BASIS OF CONVENTIONAL PPA RECONSTRUCTION METHODS

BACKGROUND OF THE INVENTION

1. Field of the Invention

The present invention generally concerns magnetic resonance tomography (MRT) as used in medicine for examination of patients. The present invention more specifically concerns a method as well as an MRT system for implementation of the method that employ image reconstruction based in partial parallel acquisition (PPA) of the raw data.

2. Description of the Prior Art

MRT is based on the physical phenomenon of magnetic resonance and has been successfully used as an imaging method for over 15 years in medicine and biophysics. In this examination modality, the subject is exposed to a strong, constant magnetic field. The nuclear spins of the atoms in the subject, which were previously randomly oriented, thereby align.

Radio-frequency energy can now excite these "ordered" nuclear spins to a specific oscillation. In MRT, this oscillation generates the actual measurement signal, which is acquired by suitable reception coils. By the use of inhomogeneous magnetic fields generated by gradient coils, the measurement subject can be spatially coded in all three spatial directions. This allows a free selection of the slice to be imaged, so slice images of the human body can be acquired in all directions. MRT as a tomographic image method in medical diagnostics is distinguished predominantly as a "non-invasive" examination method with a versatile contrast capability. Due to the excellent representation of the soft tissue, MRT has developed into a method superior in many ways to x-ray computed tomography (CT). MRT today is based on the application of spin echo and gradient echo sequences that enable an excellent image quality with measurement times in the range of seconds to minutes.

The continuous technical development of the components of MRT apparatuses and the introduction of faster imaging sequences are constantly making more fields of use in medicine amenable to MRT. Real-time imaging to support minimally-invasive surgery, functional imaging in neurology and perfusion measurement in cardiology are only a few examples. In spite of the technical progress in the construction of MRT apparatuses, acquisition time and signal-to-noise ratio (SNR) of an MRT image remain limiting factors for many applications of MRT in medical diagnostics.

Particularly in the case of functional imaging, in which a significant movement of the subject, or parts of the subject, is present (blood flow, heart movement, peristalsis of the abdomen etc.), a reduction of the measurement time (the data acquisition time) is desirable without loss of good SNR. Movement generally causes artifacts in an MRT image such as, for example, movement artifacts that increase with the duration of the data acquisition time. In order to improve the image quality, it would be conceivable to acquire multiple images and to later superimpose these. This does not always lead to an intended improvement of the total image quality, particularly with regard to the movement artifacts. For example, the SNR is improved while the movement artifacts accumulate.

One approach to shorten the measurement time while maintaining good SNR is to reduce the quantity of the acquired image data. In order to acquire a complete image from such a reduced data set, either the missing data must be reconstructed with suitable algorithms or the flawed image from the reduced data must be corrected. The acquisition of the data in MRT occurs in what is known as k-space (spatial frequency domain). The MRT image in the image domain is linked with the MRT data in k-space by means of Fourier transformation. The spatial coding of the subject that spans k-space occurs by means of gradients in all three spatial directions. In the case of 2D imaging, differentiation is made among slice selection (establishes an acquisition slice in the subject, typically the z-axis), frequency coding (establishes a direction in the slice, typically the x-axis) and phase coding (determines the second dimension within the slice, typically the y-axis). These are achieved by respective magnetic field gradients. In the case of 3D imaging, the slice selection is replaced by a second phase coding direction. Without limitation as to generality, a two-dimensional Cartesian k-space is assumed herein that is sampled line-by-line. The data of a single k-space line are frequency-coded by means of a gradient upon readout. Each line in k-space has the interval $\Delta ky$ that is generated by a phase coding step. Since the phase coding takes a great deal of time in comparison with the other spatial codings, methods (for example partial parallel acquisition, (PPA) have been developed that reduce the number of time-consuming phase coding steps, so as to shorten the image measurement time. The fundamental idea of PPA imaging is that the k-space data are not acquired by a single coil, but rather (as shown in FIG. 3A) by a (for example linear) arrangement of component coils (coil 1 through coil 3), namely a coil array. Each of the spatially-independent independent coils of the array carries certain spatial information which is used in order to achieve a complete spatial coding by a combination of the simultaneously-acquired coil data. This means that a number of other unsampled lines 32 (shown dotted in the following figures) that are displaced in k-space can be determined (i.e. reconstructed) from a single acquired k-space line 31 (shown in grey in the following figures). Such completed reconstructed data sets are shown in FIG. 3B for the case of three component coils.

The PPA methods thus use spatial information contained in the components of the coil arrangement in order to partially replace the time-consuming phase coding that is normally done using a phase coding gradient. The image measurement time is thereby reduced corresponding to the ratio of number of the lines of the reduced data set to the number of the lines of the conventional (thus completed) data set. In comparison to conventional data acquisition, in a typical PPA acquisition only a fraction (½, ⅓, ¼, etc.) of the phase coding lines are acquired. A special reconstruction is then applied to the data in order to reconstruct the missing k-space lines and thus to obtain the full field of view (FOV) image in a fraction of the time.

Different PPA methods respectively make use of different reconstruction techniques (normally an algebraic technique). The best known PPA methods are SENSE (sensitivity encoding) and GRAPPA (generalized auto-calibration PPA) with their respective derivatives.

In all PPA methods, additional calibration data points are necessarily also acquired (in addition to the measured central reference lines, for example 33 in FIG. 3) that are added to the actual measurement data, and a reduced data set can actually be completed again only on the basis of these calibration data points.

In order to optimize the quality of the reconstruction and the SNR, a reconstruction according to GRAPPA again generates a number N of data sets (coil images) from, for example, a number N of incompletely measured data sets (except for the reference lines 33, under-sampled coil images; FIG. 2; coil 1 through coil N), which N data sets are—always still in k-space—respectively separately completed again. A Fourier transformation of the individual coil images thus leads to N foldover-free (convolution-free) individual coil images, the combination of which in the spatial domain (for example by a sum-of-squares reconstruction) leads to an image that is optimized with regard to SNR and signal loss.

The GRAPPA reconstruction (FIG. 2), which again leads to N complete individual coil data sets given N component coils, is based on a linear combination of the measured lines of an incomplete data set, with the determination of the (linear) coefficients necessary for this purpose being emphasized. For this purpose it is attempted to linearly combine the regular measured (thus not omitted) lines of an incomplete data set such that the additionally-measured reference lines (thus the calibration data points) can be fitted optimally well. The reference lines thus serve as target functions, the adaptation of which improves as the number of regular measured lines increases. These measured lines may possibly be distributed among incomplete data sets of different component coils.

This means that, in the framework of a GRAPPA reconstruction, the incomplete data sets of N component coils must in turn be mapped to the N component coils to complete these data sets. In the context N GRAPPA input channels are mapped to N GRAPPA output channels. This "mapping" ensues algebraically through a vector matrix multiplication, with the vectors representing the regular measured k-space lines and the matrix representing the determined GRAPPA coefficient matrix. In other words, this means that: if a linear combination of measured lines on the basis of a coefficient matrix results in a good approximation of the reference lines (calibration data points), omitted (and thus not measured) lines of equal number can likewise be reconstructed well with this matrix. The coefficients are often also designated as weighting factors; the reference lines carry information about the coil sensitivities.

It can now be shown that the calculation time for the overall reconstruction method according to GRAPPA (i.e. for the determination of the GRAPPA coefficient matrix as well as for the mapping itself) exhibits a quadratic (in many cases even a "super-quadratic") dependency on the coil number N which, although not being significant given a lower coil number (8 channels <<1 minute), leads however to unacceptable calculation times with regard to computing capacity and storage capacity of the system computer given a high coil count (N≧32).

In order to satisfy the increasing requirements with regard to CPU load and computer storage in PPA imaging, the focus in this field is presently on more powerful computers with more access and primary memory (RAM), as well as on multiprocessor-based parallel-operating computers that can execute the PPA reconstruction algorithms in parallel. Both approaches represent a substantial cost increase.

SUMMARY OF THE INVENTION

An object of the present invention is to provide a method as well as a system for implementation of the method that accelerate the PPA reconstruction, in particular given use of a high number of PPA-coding component coils., with no more than a slight increase in SNR and with none or only slight undersampling artifacts in the reconstructed image.

This object is achieved according to the invention by a method for magnetic resonance imaging of a contiguous region of a human body on the basis of a partially-parallel acquisition (PPA) by excitation of nuclear spins and measurement of radio-frequency signals representing the excited spins, wherein the spin excitation is implemented in a number of steps and measurement of an RF response signal occurs simultaneously in each of a number of N component coils, so that a number of response signals are acquired that, for each component coil, form an incomplete data set of acquired RF signals, and wherein additional acquired calibration data points exist for each incomplete data set, and wherein the N incomplete data sets are reduced to a subset of M reduced, incomplete data sets on the basis of an N×M reduction matrix, so that M reduced, incomplete data sets are obtained, and M complete data sets are then formed on the basis of an N×M reconstruction matrix, in that the non-measured lines of the M reduced, incomplete data sets are reconstructed under consideration of all N incomplete data sets, and a spatial transformation of the completed reduced data sets is implemented in order to form a complete image data set from each completed, reduced data set.

The determination of the N×M reduction matrix according to a first embodiment of the inventive method ensues from eigenvectors of the covariance matrix of the N measured, incomplete data sets and/or the calibration data points and/or the respective spatially transformed data sets According to this first embodiment, the determination of the covariance matrix ensues from parts of the measured data, or the calibration data points.

The reduction matrix is preferably determined such that it contains a minimum of non-zero reduction coefficients.

According to a second embodiment of the inventive method, the reduction matrix contains coefficients that select (in a weighted manner) the modes or a subset of the modes of a PPA coil system of the type having a mode matrix that effects a hardware-based grouping of component coils.

According to a third embodiment of the inventive method, the determination of the reduction matrix ensues on the basis of an SNR analysis of the component coils with the goal of optimization of the signal-to-noise ratio in the image data sets.

Particularly given a very high number of component coils, it is advantageous to use the inventive method in a cascaded manner, meaning that the N input channels are obtained from an already-executed preceding reduction.

With regard to the acquisition of maximum PPA coding information, central (middle) columns or central (middle) segments of the k-matrix that are situated orthogonal to the PPA coding direction are inventively used in the determination of the reduction matrix of a preceding reduction.

The reduction matrix and the reconstruction matrix (and, if applicable, the reduction matrix of a preceding reduction) can be inventively combined.

The above object is also achieved in accordance with the invention by a magnetic resonance tomography apparatus that implements the method according to any of the embodiments described above.

The above object also is achieved in accordance with the present invention by a computer software product that implements a method according to any of the above embodiments, when running on a computer of a magnetic resonance tomography apparatus.

DESCRIPTION OF THE DRAWINGS

FIG. 2 schematically shows the basic procedure of image reconstruction according to GRAPPA.

DESCRIPTION OF THE PREFERRED EMBODIMENTS

Figure 1:
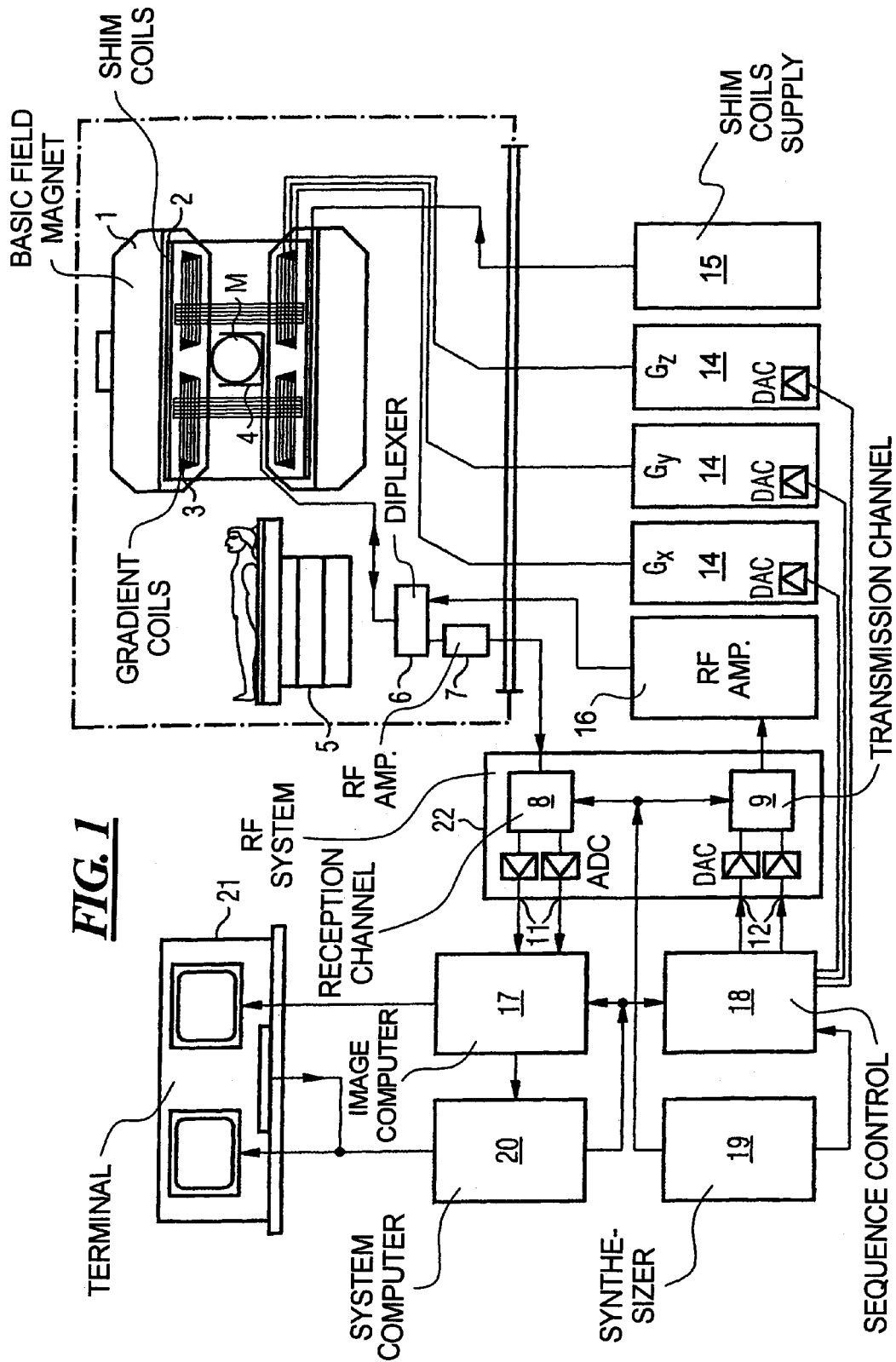
FIG. 1 is a schematic block diagram of an inventive MRT apparatus for implementation of the inventive method.
Figure 3A:
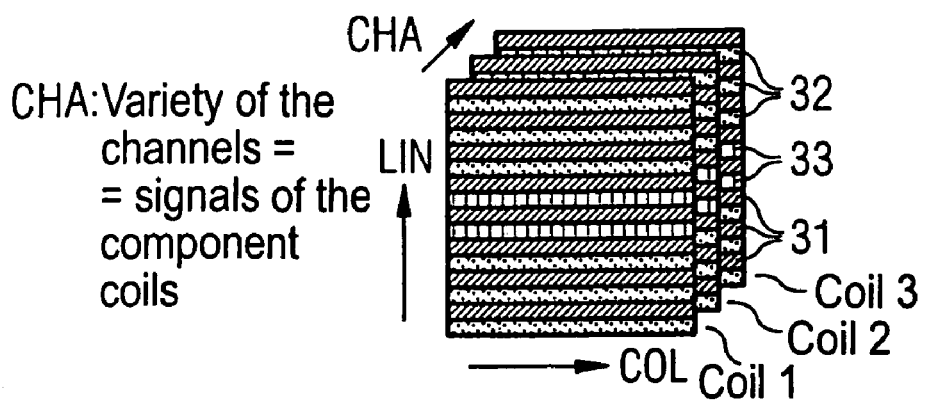
FIG. 3A shows the acquisition characteristic of the k-matrix in detail for three reduced data sets, including reference lines.
Figure 3B:
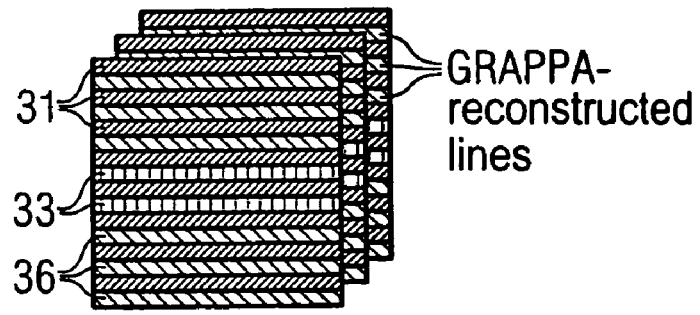
FIG. 3B shows the reconstructed (completed) data sets from FIG. 3A.

FIG. 1 is a schematic illustration of a magnetic resonance imaging or magnetic resonance tomography apparatus for generating a magnetic resonance image of a subject according to the present invention. The design of the magnetic resonance tomography apparatus thereby corresponds that of a conventional magnetic tomography apparatus, with the differences identified below. A basic field magnet 1 generates a temporally-constant strong magnetic field for polarization or alignment of the nuclear spins in the examination region of a subject such as, for example, of a part of a human body to be examined. The high homogeneity of the basic magnetic field necessary for the magnetic resonance measurement is defined in a spherical measurement volume V in which the parts of the human body to be examined are introduced. To support the homogeneity requirements, and in particular for elimination of temporally invariable influences, shim plates made of ferromagnetic material are mounted at a suitable location. Temporally variable influences are eliminated by shim coils 2 that are activated by a shim power supply 15.

A gradient coil system 3 is composed of a number of windings (sub-windings) is disposed in the basic field magnet 1. Each sub-winding is supplied with current by an amplifier for generation of a linear gradient field in the respective directions of the Cartesian coordinate system. The first sub-coil of the gradient coil system 3 thereby generates a gradient Gx in the x-direction, the second sub-coil generates a gradient Gy in the y-direction and the third sub-coil generates a gradient Gz in the z-direction. Each amplifier includes a digital-analog converter that is activated by a sequence controller 18 for time-accurate generation of gradient pulses.

Located within the gradient coil system 3 is a radio-frequency antenna 4 that converts the radio-frequency pulses emitted by a radio-frequency power amplifier into an alternating magnetic field for excitation of the nuclei and alignment of the nuclear spins of the subject to be examined or of the region of the subject to be examined. The radio-frequency antenna 4 includes one or more RF transmission coils and a number of RF reception coils in the form, for example, of a linear array of component coils in PPA imaging systems. The alternating field originating from the precessing nuclear spins (i.e. normally the nuclear spin echo signals caused by a pulse sequence composed of one or more radio-frequency pulses and one or more gradient pulses) is also converted by the RF reception coils of the radio-frequency antenna 4 into a voltage that is supplied via an amplifier 7 to a radio-frequency reception channel 8 of a radio-frequency system 22. The radio-frequency system 22 furthermore has a transmission channel 9 in which are generated the radio-frequency pulses for excitation of the magnetic resonance. The respective radio-frequency pulses are thereby digitally represented in the sequence controller 18 as a series of complex numbers based on a pulse sequence predetermined by the system computer 20. The real and imaginary parts of this number series are respectively supplied via inputs 12 to a digital-analog converter in the radio-frequency system 22, and from this to a transmission channel 9. In the transmission channel 9, the pulse sequences are modulated with a radio-frequency carrier signal having a base frequency that corresponds to the resonance frequency of the nuclear spins in the measurement volume.

The switch-over from transmission to reception operation ensues via a transmission-reception diplexer 6. The RF transmission coil of the radio-frequency antenna 4 radiates the radio-frequency pulses for excitation of the nuclear spins into the measurement volume V for excitation of the nuclear spins and samples resulting echo signals via the RF reception coils. The correspondingly-acquired magnetic resonance signals are phase-sensitively demodulated in the reception channel 8 of the radio-frequency system 22 and translated into a real part and an imaginary part of the measurement signal via respective analog-digital converters. An image is reconstructed by an image computer 17 from the measurement data acquired in this manner. The administration of the measurement data, the image data and the control programs ensues via the system computer 20. Based on requirements set by control programs, the sequence controller 18 monitors the generation of the respective desired pulse sequences and the corresponding sampling of k-space. The sequence controller 18 in particular controls the time-accurate switching of the gradients, the emission of the radio-frequency pulses with defined phase and amplitude and the reception of the magnetic resonance signals. The time base for the radio-frequency system 22 and the sequence controller 18 is provided by a synthesizer 19. The selection of suitable control programs for generation of a magnetic resonance image as well as the representation of the generated magnetic resonance image ensues through a terminal (console) 21 that has a keyboard as well as one or more display screens.

In order to be able to implement PPA measurements with an MRT apparatus, it is standard (in particular in the phase coding direction (y-direction, LIN) to not use a single coil but rather to use an arrangement composed of a number of coils. The coils or such an arrangement, known as component coils, are connected to form a coil array and are arranged mutually adjacent or overlapping one another, so adjoining, overlapping coil images can likewise be acquired. If the acquisition time should not be lengthened given improvement of the SNR, the coils of a coil array must acquire signals simultaneously. Each coil consequently requires its own receiver channel which, as already mentioned, includes a preamplifier, mixer and analog-digital converter. This hardware is very expensive, which in practice leads to a limitation of the coil count in an array. Arrays with a maximum of 32 individual coils are presently the rule.

Developments are in existence, however, to significantly increase the number of the component coils of a PPA coil array. Systems with up to 96 PPA input channels are in the testing phase. It has thereby been shown that this high number of PPA coils drastically increases the requirements for the hardware and software of the system computer or the system controller, for example with regard to computing capacity and storage space. In some PPA methods, this increase of the capacity requirement is particularly high, for example in GRAPPA, which exhibits a super-quadratic dependency of the image reconstruction calculation time on the number of the participating component coils. It is the goal of the present invention to accelerate the GRAPPA image reconstruction methods such that the calculation time is held within acceptable limits even given a high coil count.

Figure 4A:
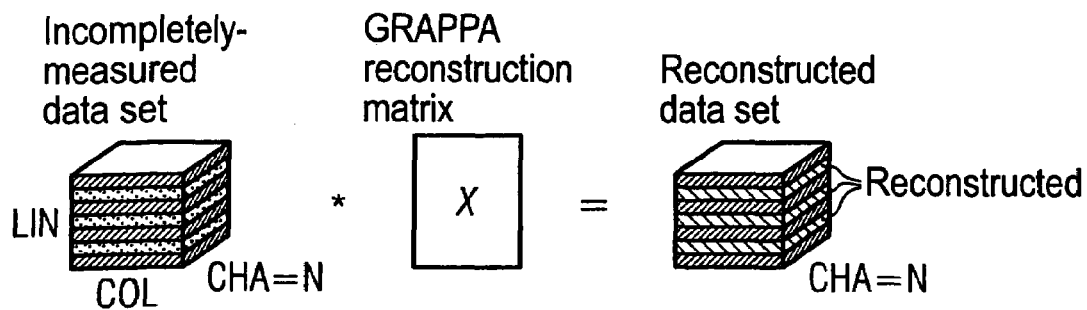
FIG. 4A schematically shows the effect of a conventional GRAPPA reconstruction matrix on a block of uncompleted data sets.
Figure 4B:
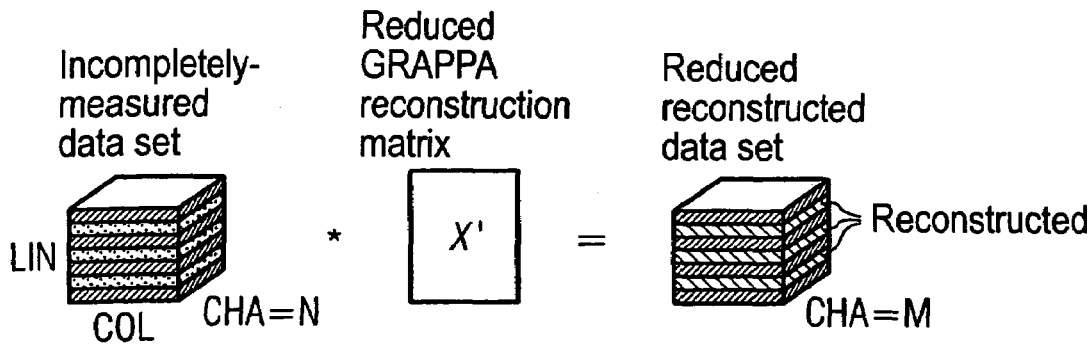
FIG. 4B shows the effect of an inventive reduced GRAPPA reconstruction matrix on a block of uncompleted data sets.
Figure 5:
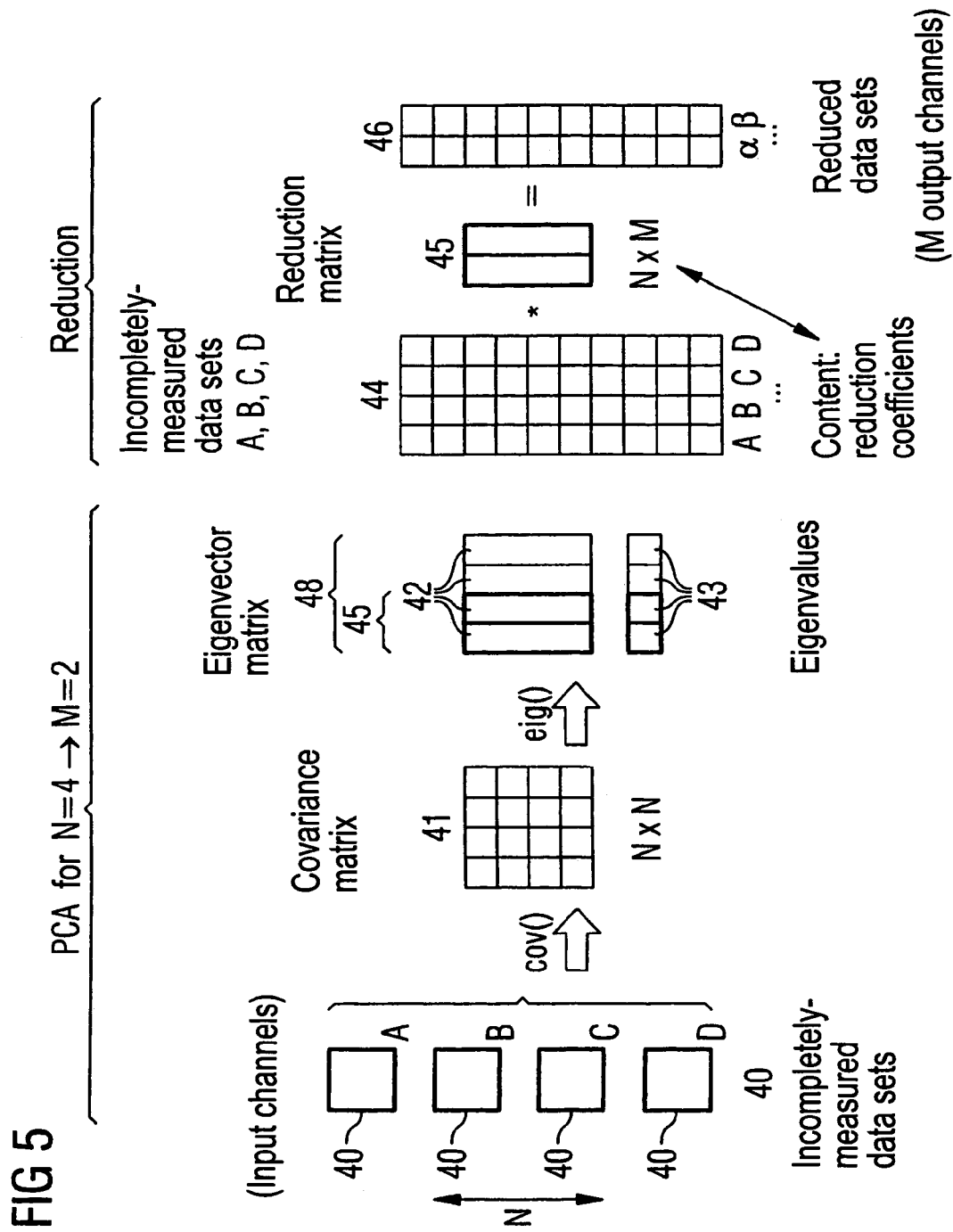
FIG. 5 schematically shows a PCA (principle component algorithm) algorithm for determination of a 4×2 reduction matrix.

This is achieved by reducing the total number of reception channels (PPA coils) participating in the GRAPPA image reconstruction at the output side. For this purpose, all participating N coils are no longer mapped in turn to N coils by means of an N×N GRAPPA reduction matrix (X) (for example FIG. 4A), but instead (according to FIG. 4B) are inventively mapped to a lower number M of output channels by a reduced N×M GRAPPA reconstruction matrix (X'), starting from a number N of input channels 40 (FIG. 5). Only a slight reduction of the output channels already avoids the complexity of the GRAPPA reconstruction matrix, such that the required calculation time for GRAPPA reconstruction is severely reduced.

The calculation time can be distinctly reduced overall by virtue of all N incompletely-measured data sets thus no longer being completed and Fourier-transformed in GRAPPA reconstruction, but instead only a subset M of incomplete data sets is formed from the N incompletely-measured data sets, and only this reduced quantity of incomplete data sets is completed, Fourier-transformed and superimposed. N and M are whole positive numbers, with N>M.

The inventive formation of this subset M, which is designated as "reduction" herein is based on the application of an N×M reduction matrix that can be formed in various manners for different purposes (goals).

One method for determination of such an N×M reduction matrix is to undertake eigenvector analysis of a covariance matrix 41, which is formed from the N incompletely-measured data sets. This method, also designated as a PCA (principle component analysis) algorithm is explained in the following using FIG. 5 for a channel reduction from N=4 to M=2 channels.

The starting basis is N=4 measured, incomplete data sets 40 of four component coils (four input channels) arranged in the phase coding direction.

The respective data sets 40 are designated with A, B, C and D and each contain an equal number of values (measured frequency entries or coefficients of the k-matrix). These data sets A, B, C, D are now statistically compared with one another by forming a covariance matrix 41 covo. The covariance matrix cov(A,B,C,D) describes the degree of the variance (or covariance) with one another of the measurement value series A, B, C, D and is the sum of the average deviation products of the variables in question. A subsequent eigenvector analysis of the covariance matrix enables the determination of the eigenvectors 42 of the PPA coil system that, set side-by-side, form the eigenvector matrix 48 eig( ) of the system as well as the eigenvalues 43 corresponding to the respective eigenvectors 42. The size of the eigenvalues 43 represents the information content of the respective eigenvector 42.

If the eigenvectors 42 are sorted according to their eigenvalues according to size (for example largest eigenvalue all the way to the left, smallest eigenvalue all the way to the right), the eigenvector matrix 48 attains an importance gradation of the columns (eigenvectors 42) from left to right.

If a channel reduction from the N=4 channels to, for example, M=2 channels should now be effected, the M=2 left eigenvectors are selected that, taken together with the N×M reduction matrix 45, form this channel reduction given the most minimal information loss (the remaining N−M=4−2=2 eigenvectors are discarded). The reduction coefficients form the content of the reduction matrix 45.

If the N×M reduction matrix 45 so obtained is thus applied to the N incompletely-measured data sets A, B, C, D (in the sense of a matrices multiplication of the matrices 44 and 45), M reduced data sets α, β are thus obtained that as such form M output channels in the form of a matrix 46.

The matrix 44 is generated via stringing together the measurement values of A, B, C and D, whereby it is indifferent as to in which order these measurement values are listed as long as this occurs in the same manner for all channels A, B, C and D. The number of these measurement values can be multiple thousands and is indicated by points. The obtained reduced data sets α, β do in fact respectively contain the same number of measurement values such as A, B, C, D, but separately no longer represent real measurement series since the values of A, B, C and D have been reduced and mixed via the reduction, and in fact such that maximal image information is retained in the reduction.

Each of the reduced data sets α, β, is separately always still incomplete to the same degree as A, B, C or D and must first be completed via GRAPPA reconstruction before M-variants of a complete image 34 can be obtained in the spatial domain by means of Fourier transformation.

Figure 6:
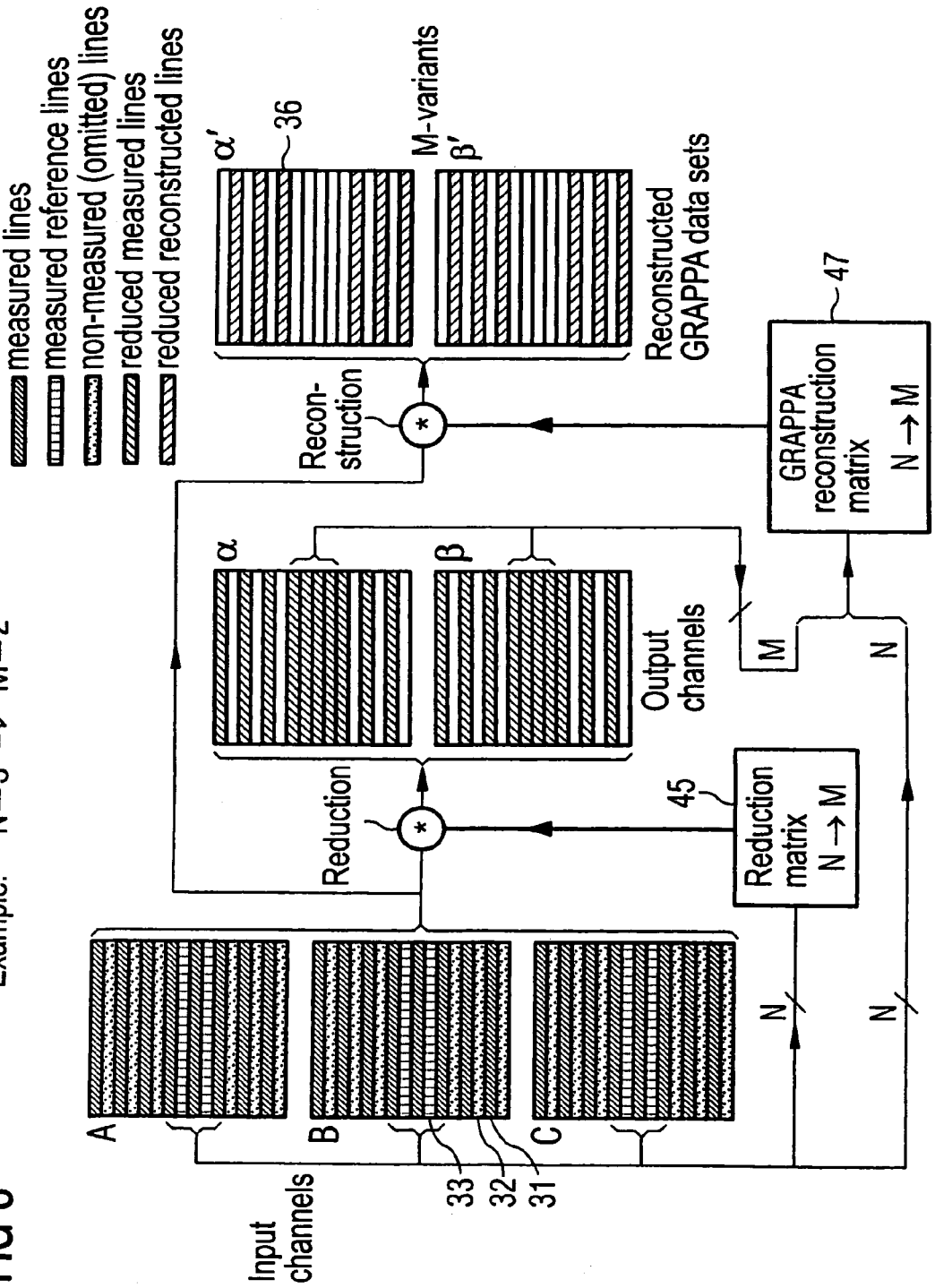
FIG. 6 schematically shows the inventive reduction of 3 input channels to 2 output channels using a reduction matrix as well as a GRAPPA reconstruction matrix.

FIG. 6, which schematically represents a reduction of three input channels A, B, C to 2 output channels α, β, supplies a better overview of the entire inventive method.

Each input channel A, B, C contains ten measured lines 31, 33, with two lines in the middle being reference lines (calibration data points 33). Six lines 32 were omitted in the sense of the PPA technique, which is why A, B, C are incomplete.

By the application of an N×M reduction matrix to A, B, C, specific values of A, B, C are selected and combined such that only two data sets (what are known as reduced data sets) α, β are obtained. α, β are incomplete to the same degree as A, B and C (respectively six omitted lines 32). The respective six omitted lines of α and β can, however, be reconstructed on the basis of a GRAPPA reconstruction by means of an N×M GRAPPA reconstruction matrix 47, thereby obtaining reconstructed GRAPPA data sets α', β'. For this purpose, according to the GRAPPA method reconstruction, coefficients are determined, for all measured lines of the input channels A, B, C and for the lines of the M output channels α, β obtained through the reduction. As can be seen in FIG. 6, the lines of the reduced data sets α, β with the reconstructed lines of the reconstructed GRAPPA data sets α', β' are situated on gaps, such that a combination of α and α', or a combination of β and β', again forms a complete data set that, according to GRAPPA, results in complete images 34 after Fourier transformation in the spatial domain, which images 34 are combined pixel-by-pixel in the spatial domain.

This ultimately leads to a GRAPPA-based summation 35 (high SNR), however overall with a reduced calculation time since henceforth M output channels instead of N are considered due to the reduction.

In this embodiment of the GRAPPA reconstruction with an inventive reduction, the reduction itself has a cost, namely the application of the reduction matrix to the data sets of the input channels (matrix multiplication 44*45). Thus calculation time must be reinvested and the calculation time savings does not have an effect to a large degree.

A further effect on the calculation time saving is the determination of the reduction matrix 45 on the basis of the PCA algorithm, since the formation of the covariance matrix 41 represents a calculation-time-intensive step (all measurement values of all N input channels A, B, C, D must be compared with one another).

For this reason, in the framework of this invention, alternatives to the determination of a reduction matrix 45 are proposed that lead to a reasonable compromise between calculation time savings and resulting image quality.

The reduction matrix 45 thus can be determined on the basis of an SNR analysis of the participating component coils 40, whereby in the sense of a calculation time savings it is likewise advantageous to keep the number of the reduction coefficients minimal. Only a single reduction coefficient per reduction matrix column would be particularly advantageous since, in such a case, the reduction step would no longer require calculation capacity in the narrower sense (the corresponding values of the data matrix 44 would merely have to be adopted into the matrix 46).

Furthermore, it can be advantageous to implement the inventive method in a cascaded manner such that, for example, the N output channels from an already-occurred preceding reduction have been obtained. It would likewise be advantageous (in particular in such a case) to combine the reduction matrix and the reconstruction matrix of each cascade.

In the case of the cascaded application, in the determination of the first reduction matrix 45 it should be taken into account that the N incomplete data sets α, β reduced in advance contain maximal PPA coding information, dependent on the selection of the slice to be acquired.

Figure 7:
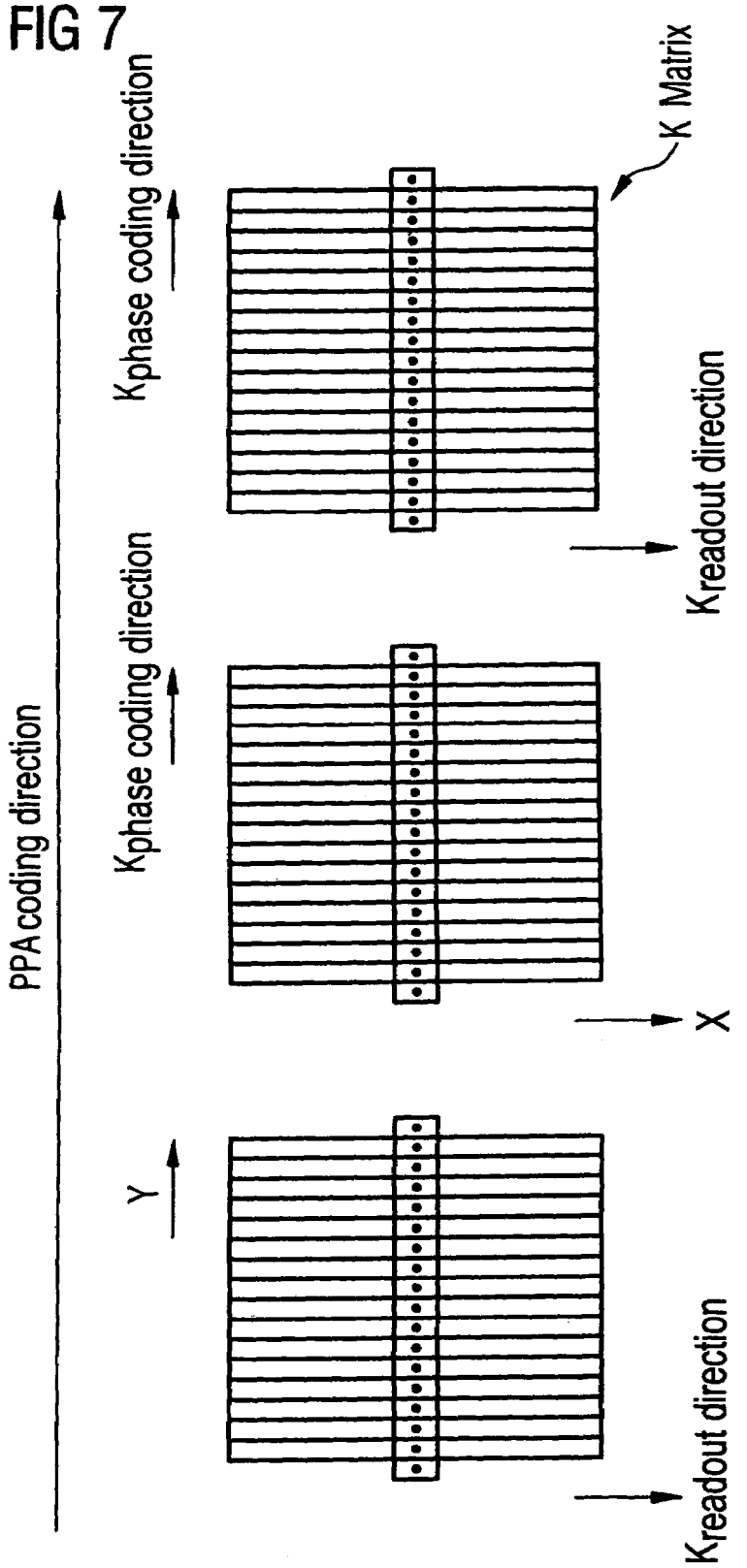
FIG. 7 schematically shows central k-space segments orthogonal to the PPA coding direction which can be used for the acquisition of maximum PPA coding information with a PCA algorithm.

In the case of a PCA algorithm this can occur by forming the covariance matrix 41 on the basis of central columns or central segments of the k-matrix that are situated in the direction of the PPA coding direction. This is shown in FIG. 7, in which the central segment represents a vector of the k-matrix in the PPA coding direction. The values of the vector are symbolized with points and in three different representation forms:

phase coding direction and readout direction in the frequency domain (k-space), phase coding direction in k-space and readout direction in the spatial domain x and phase coding direction in the spatial domain y and readout direction in k-space.

Further combinations are possible as long as the consideration or, respectively, the comparison of the different, respectively adjacent segments ensues orthogonal to the PPA coding direction. It should be noted that the inventive method can also be applied to two-dimensional PPA coding (integrated parallel acquisition technique squared, iPAT$^2$), for example in two phase coding directions orthogonal to one another.

In the case that the PPA measurements are implemented with MRT apparatuses that use a TIM coil system with a mode matrix, the determination of the reduction matrix 45 can ensue on the basis of the properties of the mode matrix. Mode matrix coil systems (described in detail in US 2004/0193038 A1) provide a very high number of coil elements (component coils), whereby as a rule adjacent coils are combined in hardware into groups and thus are combined differently (if applicable with different combination coefficients). In this manner the redundancy in the spatial coverage of the coil sensitivities can be utilized with regard to a channel reduction. A three-way grouping leads, for example, to a primary channel, a secondary channel and a tertiary channel. The sole consideration of primary channels as a result of the reduction would thus lead to a channel reduction by a factor of 3.

In such PPA coil systems with a mode matrix (which thus have a hardware-based grouping of component coils), the determination of the reduction matrix 45 can ensue in a simple manner via a weighted selection of coefficients which form the modes or a subset of the modes of such a system. Since, in a certain aspect, the mode matrix of such a TIM system represents the reduction matrix of the inventive method, the calculation time for determination of the reduction matrix can be saved, which is why the inventive method can be applied particularly advantageously given use of TIM systems.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for magnetic resonance imaging by partial parallel acquisition of magnetic resonance data from an examination subject, comprising the steps of:

exciting nuclear spins in an examination subject by radiating the subject with radio frequency energy in a plurality of steps, and thereby exciting a magnetic resonance signal in the subject, and simultaneously receiving the magnetic resonance signal with each of a plurality of N component coils;

for each of said N component coils, forming an incomplete data set of the received magnetic resonance signals, and acquiring additional calibration data points for each incomplete data set, thereby forming N incomplete datasets;

reducing said N incomplete data sets to a subset of M reduced incomplete data sets, with M<N, by applying an N×M reduction matrix of eigenvectors to said N incomplete data sets, thereby obtaining M reduced, incomplete data sets;

forming M complete data sets by applying an N×M reconstruction matrix to said M, incomplete data sets, causing non-measured lines of said M, incomplete data sets to be reconstructed with reconsideration of all of said N incomplete data sets; and spatially transforming said M complete data sets to form a complete image data set from each of said M complete data sets.

2. A method as claimed in claim 1 comprising electronically forming said N×M reduction matrix from eigenvectors of data selected from the group consisting of a covariance matrix of said N measured, incomplete data sets, said calibration data points, and the respectively spatially transformed M complete data sets.

3. A method as claimed in claim 2 comprising employing said covariance matrix as said data from which said eigenvectors are formed, and calculating said covariance matrix from portions of data selected from measured data represented by said magnetic resonance signals, and said calibration data points.

4. A method as claimed in claim 1 comprising forming said N×M reduction matrix of eigenvectors with a minimum of non-zero reduction coefficients.

5. A method as claimed in claim 4 comprising forming said N×M reduction matrix of eigenvectors with coefficients that select, by weights, modes or a subset of modes of a PPA coil system with a mode matrix that forms a hardware-based grouping of said component coils.

6. A method as claimed in claim 1 comprising determining said N×M reduction matrix of eigenvectors by conducting a signal-to-noise ratio analysis of said component coils to optimize a signal-to-ratio in said image data sets.

7. A method as claimed in claim 1 comprising using channels obtained from a preceding reduction as channels for said N component coils.

8. A method as claimed in claim 7 comprising, in said preceding reduction, maximizing PPA coding information by forming central columns or central segments of a k space matrix parallel to a PPA coding direction.

9. A method as claimed in claim 1 comprising combining said reduction matrix of eigenvectors and said reconstruction matrix.

10. An apparatus configured for magnetic resonance imaging by partial parallel acquisition of magnetic resonance data from an examination subject, comprising the steps of:
    an RF transmitter that radiates RF energy into an examination subject in a plurality of steps in order to excite nuclear spins in said examination subject, and thereby exciting a magnetic resonance signal in the subject, and a receiving array in order to simultaneously receive the magnetic resonance signal with each of a plurality of N component coils of said receiver array;
    an image computer that, for each of said component coils, forms an incomplete data set of the received magnetic resonance signals, and that acquires additional calibration data points of each incomplete data set, thereby forming N incomplete data sets;
    said image computer reducing said N incomplete data sets into a reduced subset of M reduced incomplete data sets, with M<N, by applying an N×M reduction matrix to said N incomplete data sets, thereby obtaining M reduced, incomplete data sets;
    said image computer forming M complete data sets by applying an N×M reconstruction matrix of eigenvectors to said M reduced, incomplete data sets, causing non-measured lines of said M reduced, incomplete data sets to be reconstructed with reconsideration of all of said N incomplete data sets; and spatially transforming said M complete data sets in order to form a complete image data set from each of said M complete data sets.

11. A data storage medium encoded with computer readable data, loadable into a control computer of a magnetic resonance imaging apparatus, configured for magnetic resonance imaging by partial parallel acquisition of magnetic resonance data from an examination subject, by causing said control computer to:
    operate an RF transmitter in order to excite nuclear spins in an examination subject by radiating the subject with radio frequency energy in a plurality of steps, and thereby exciting a magnetic resonance signal in the subject, and simultaneously receive the magnetic resonance signal with each of a plurality of N component coils;
    have each of said N component coils, form an incomplete data set of the received magnetic resonance signals, and acquire additional calibration data points of each incomplete data set, thereby forming N incomplete data sets;
    reduce said N incomplete data sets into a subset of M incomplete data sets, with M<N, by applying an N×M reduction matrix of eigenvectors to said N incomplete data sets thereby obtaining M incomplete data sets;
    form M complete data sets by applying an N×M reconstruction matrix to said M incomplete data sets, causing non-measured lines of said M incomplete data sets to be reconstructed with reconsideration of all of said N incomplete data sets; and
    spatially transform said M complete data sets in order to form a complete image data set from each of said M complete data sets.

* * * * *